(12) United States Patent
Jin et al.

(10) Patent No.: US 7,112,974 B1
(45) Date of Patent: Sep. 26, 2006

(54) PROBLE FOR TESTING INTEGRATED CIRCUITS

(75) Inventors: Bo Jin, Campbell, CA (US); Qi Gu, Fremont, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 593 days.

(21) Appl. No.: 10/154,089

(22) Filed: May 23, 2002

(51) Int. Cl.
*G01R 31/02* (2006.01)

(52) U.S. Cl. ..................................... 324/754

(58) Field of Classification Search ................ 324/754, 324/760–762, 765, 158.1, 764; 438/14
See application file for complete search history.

(56) References Cited

U.S. PATENT DOCUMENTS

| | | | | |
|---|---|---|---|---|
| 4,754,316 A | * | 6/1988 | Reid | 257/777 |
| 5,070,297 A | * | 12/1991 | Kwon et al. | 324/754 |
| 5,338,223 A | * | 8/1994 | Melatti et al. | 439/482 |
| 5,380,318 A | * | 1/1995 | Daikuzono | 606/16 |
| 5,600,257 A | * | 2/1997 | Leas et al. | 324/754 |
| 5,763,879 A | * | 6/1998 | Zimmer et al. | 250/306 |
| 5,850,148 A | * | 12/1998 | Nam | 324/761 |
| 6,130,104 A | * | 10/2000 | Yamasaka | 438/14 |
| 6,208,155 B1 | * | 3/2001 | Barabi et al. | 324/754 |
| 6,246,245 B1 | * | 6/2001 | Akram et al. | 324/754 |
| 6,469,530 B1 | * | 10/2002 | Johnson et al. | 324/754 |
| 6,759,858 B1 | * | 7/2004 | Roggel | 324/754 |

* cited by examiner

*Primary Examiner*—Jermele Hollington
*Assistant Examiner*—Tung X. Nguyen
(74) *Attorney, Agent, or Firm*—Okamoto & Benedicto LLP

(57) ABSTRACT

In one embodiment, a probe for testing integrated circuits includes a body having a tip and a hardening material on the tip. The hardening material helps improve the hardness of the tip. The hardening material thus allows the probe to reliably penetrate a layer to make a good electrical connection with a contact point under the layer, for example. In one embodiment, an electrically conductive coating is deposited over the hardening material.

14 Claims, 4 Drawing Sheets

PROBLE FOR TESTING INTEGRATED CIRCUITS

CROSS-REFERENCE TO RELATED APPLICATION

This application is related to the following commonly-assigned disclosure, which is incorporated herein by reference in its entirety: U.S. application Ser. No. 10/144,676, now U.S. Pat. No. 6,847,218, entitled "PROBE CARD WITH AN ADAPTER LAYER FOR TESTING INTEGRATED CIRCUITS", filed on May 13, 2002, by James Nulty, Brenor Brophy, Tom McCleary, Bo Jin, Qi Gu, Thurman J. Rodgers, and John O. Torode.

BACKGROUND OF THE INVENTION

1. Field of the Invention

The present invention relates generally to integrated circuits, and more particularly to methods and apparatus for testing integrated circuits.

2. Description of the Background Art

A system for testing integrated circuits may include a tester, a probe card, and a prober. The tester is typically a commercially available automated test equipment (ATE), such as those available from Advantest Corporation, for example. The prober supports and houses the integrated circuit being tested, which is also referred to as the "device under test" or DUT. The prober may also house the probe card. The probe card electrically couples the tester to the DUT, thereby allowing the tester to send and receive electrical signals to and from the DUT.

A typical probe card includes a wired connection to a tester. A probe card also includes a removable connection to a DUT. This removable connection, referred to as a "probe", is attached to the probe card. During testing, the probe is touched down on a contact point such as a metal pad on the DUT. Because the tester is electrically coupled to the DUT via the probe, it is desirable to have a probe that makes a good electrical connection with a contact point.

SUMMARY

In one embodiment, a probe for testing integrated circuits includes a body having a tip and a hardening material on the tip. The hardening material helps improve the hardness of the tip. The hardening material thus allows the probe to reliably penetrate a layer to make a good electrical connection with a contact point under the layer, for example. In one embodiment, an electrically conductive coating is deposited over the hardening material.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not necessarily to scale unless otherwise noted.

DETAILED DESCRIPTION

In the present disclosure, numerous specific details are provided such as examples of materials, dimensions, components, and methods to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1A:
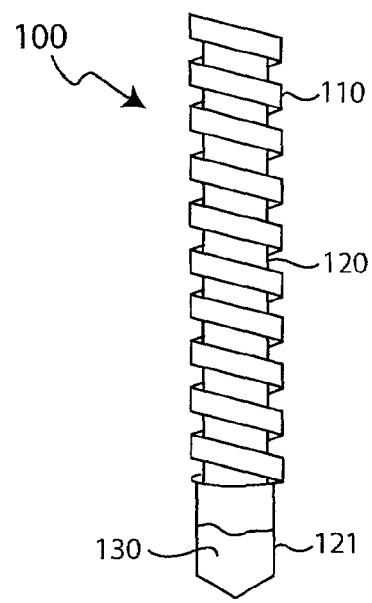
FIG. 1A shows a schematic representation of a probe in accordance with an embodiment of the present invention.

Referring now to FIG. 1A, there is shown a schematic representation of a probe 100 in accordance with an embodiment of the present invention. Probe 100 includes a spring 110 and a probe body 120. The end of body 120 that touches a contact point on a DUT is denoted as a tip 121. A portion of tip 121 may include a hardening component 130. Probe 100 is also referred to as a pogo-type probe. It is to be noted, however, that the present invention is not limited to pogo-type probes. For example, hardening component 130 may be incorporated in other types of probes including cantilever probes.

Spring 110 provides vertical movement to body 120. When tip 121 touches a contact point on a DUT, body 120 may telescope in the vertical direction to compensate for imperfections in the planarity of the DUT or other such imperfections in the tester system. This allows multiple probes 100 to make an electrical connection with corresponding contact points on a DUT even when the contact points, for example, are not level.

In the embodiment of FIG. 1A, spring 110 is slipped over body 120 and rests on a shoulder (see shoulder 122 in FIG. 1B) disposed before tip 121. Other means of preventing spring 110 from slipping off past tip 121 may also be employed without detracting from the merits of the present invention.

The specifications of probe 100, such as spring length, body length, etc., may vary depending on implementation. Some specifications are given below for illustration purposes only and should not be construed as limiting.

Spring 110 may have an uncompressed (i.e., relaxed) length of about 5 mm (milli meter). Spring 110 is preferably, but not necessarily, comprised of stainless steel. Spring 110 may have an outside diameter of about 76.2 μm (micro meter) and an inside diameter of about 63.5 μm. Spring 110 may have a spring force of 20–35 grams and may be compressed 500–800 μm.

Figure 1B:
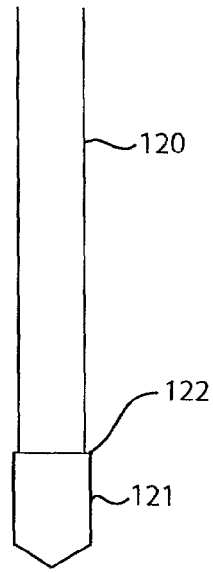
FIG. 1B shows a schematic representation of a probe body in accordance with an embodiment of the present invention.

FIG. 1B schematically illustrates a body 120 in accordance with an embodiment of the present invention. For clarity of illustration, body 120 is depicted without spring 110 and hardening component 130. In the embodiment of FIG. 1B, body 120 includes a shoulder 122 for arresting the movement of a spring 110. As mentioned, other means of preventing spring 110 from slipping off past tip 121 may also be employed. That is, tip 121 may also be of the same diameter as the rest of body 120.

Body 120 may be 7–8 mm long and have a diameter similar to the inside diameter of spring 110 (e.g., 63.5 µm). Body 120 may be made of an electrically conductive material, such as tungsten, rhenium, beryllium copper, etc. Body 120 may have a contact resistance of less than 50 mΩ (milli-Ohm), a maximum current carrying capacity of 250–500 mA (milli-Amp), and an operating temperature range between −45° C. and +150° C. (degree Centigrade), for example. Body 120 is preferably, but not necessarily, manufactured to withstand more than 1 million touch downs on contact points.

Figure 2A:
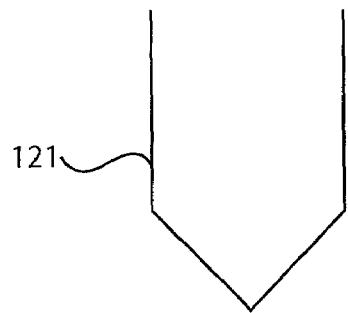
FIGS. 2A–2D show schematic representations of probe-tip shapes in accordance with embodiments of the present invention.
Figure 2B:
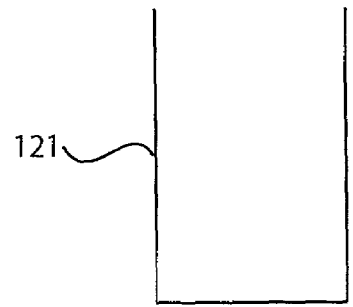
Figure 2C:
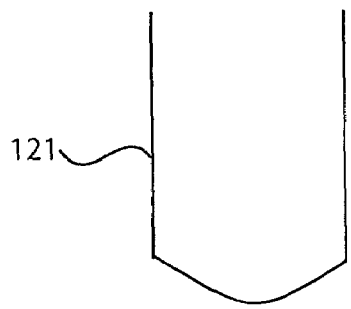
Figure 2D:
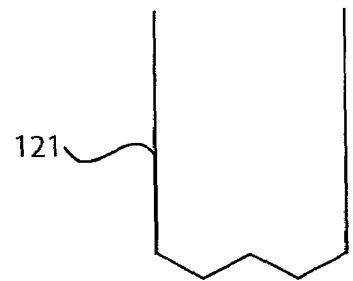

Tip 121 is the portion of body 120 that touches a contact point on a DUT. The shape of tip 121 may vary depending on the application. For example, tip 121 may have a pointy shape as shown in FIG. 2A, a flat shape as shown in FIG. 2B, a radiused shape as shown in FIG. 2C, or a 4-point crown shape as shown in FIG. 2D. A pointy-shaped tip 121 may have a diameter of 25.4 µm at the pointy end, for example.

Figure 1C:
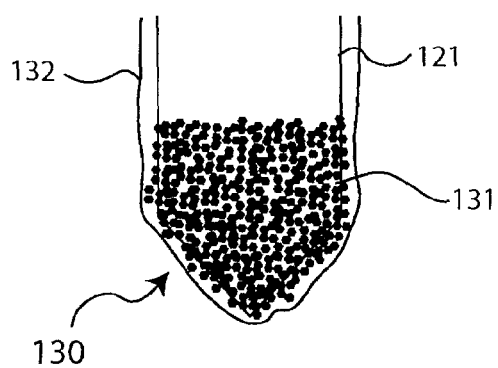
FIG. 1C shows a schematic representation of a portion of a probe tip in accordance with an embodiment of the present invention.

Referring to FIG. 1C, there is shown a schematic representation of a portion of tip 120 having a hardening component 130 in accordance with an embodiment of the present invention. Hardening component 130 includes a hardening material 131 and a conductive coating 132. Hardening material 131 may be a material that is harder than body 120. For example, hardening material 131 may be diamond dust with a particle size of about 25.4 µm or smaller. Each diamond dust particle preferably, but not necessarily, has a triangular shape. Hardening material 131 may be attached to tip 121 using a conductive epoxy or other adhesives. Hardening material 131 hardens tip 121, thereby improving its capability to penetrate through a layer of material overlying a contact point on a DUT.

Because hardening material 131 may not be electrically conductive, a conductive coating 132 may be deposited over hardening material 131. Conductive coating 132 may be of an electrically conductive material such as nickel, gold, or beryllium copper. Conductive coating 132 may be electroplated over hardening material 131, for example. As shown in FIG. 1C, conductive coating 132 may be deposited past hardening material 131 to ensure good electrical connection between conductive coating 132 and body 120 (which includes tip 121).

A probe manufacturer may build a probe 100 with the just described specifications. It is to be understood, however, that commercially available off-the-shelf probes may also be employed in accordance with embodiments of the present invention. For example, an off-the-shelf pogo-type probe or cantilever prove may incorporate a hardening component 130.

A probe 100 may be employed in various types of probe cards including commercially available probe cards. A probe 100 may also be employed in the probe cards disclosed in the commonly-assigned and incorporated herein by reference U.S. application Ser. No. 10/144,676, now U.S. Pat. No. 6,847,218, entitled "PROBE CARD WITH AN ADAPTER LAYER FOR TESTING INTEGRATED CIRCUITS", filed on May 13, 2002, by James Nulty, Benor Brophy, Tom McCleary, Bo Jin, Qi Gu, Thurman J. Rodgers, and John O. Torode.

Figure 3A:
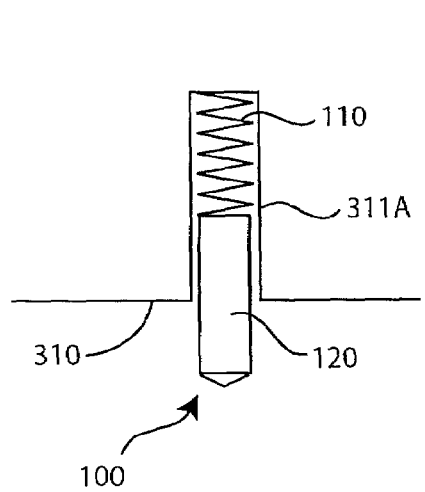
FIGS. 3A and 3B schematically illustrate how a probe may be used in a probe card in accordance with embodiments of the present invention.
Figure 3B:
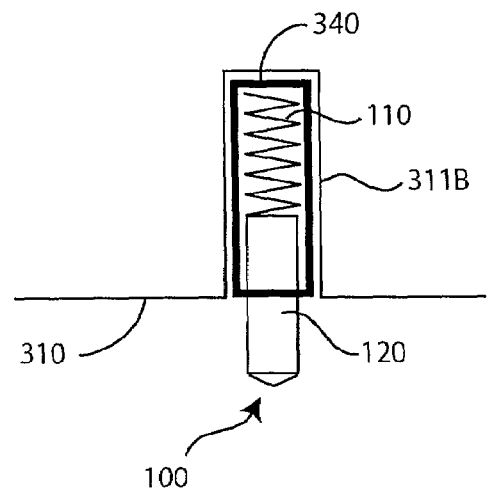

FIGS. 3A and 3B schematically illustrate how a probe 100 may be used in a probe card 310 in accordance with embodiments of the present invention. Electrical connection from probe 100 to the rest of probe card 310 is not shown for clarity of illustration. In the example of FIG. 3A, probe 100 is inserted in a hole 311A in probe card 310. Hole 311A is sized to contain spring 110 and a portion of body 120. Hole 311A may also include a component (not shown) for securing body 120 so that it does not fall out of hole 311A.

In the example of FIG. 3B, probe 100 further includes an additional component denoted as cylinder 340. Cylinder 340 contains spring 110 and goes over a portion of body 120. Body 120 may telescope into cylinder 340 to compress spring 110 during touch downs (i.e., touching of a contact point). Cylinder 340 is inserted in and attached to a hole 311B of probe card 310. Cylinder 340 may also include a component (not shown) for securing body 120 so that it does not fall out of cylinder 340. Because cylinder 340 adds to the overall diameter of probe 100, hole 311B is larger than hole 311A. Using cylinder 340 thus reduces the number of probes 100 that may be placed side by side.

Figure 4:
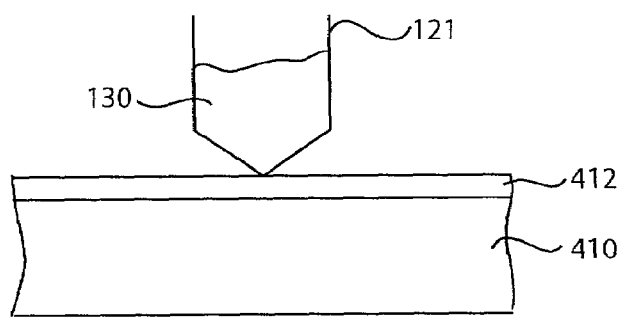
FIG. 4 schematically illustrates how a probe may be employed to make an electrical connection with a contact point in accordance with an embodiment of the present invention.

FIG. 4 schematically illustrates how a probe 100 may be employed to make an electrical connection with a contact point such as a metal pad 410 in accordance with an embodiment of the present invention. In the example of FIG. 4, a layer 412 is over metal pad 410. Layer 412 may be a layer of oxide such as actinium oxide ($Ac_2O_3$), while metal pad 410 may comprise aluminum, for example. Thus, in the example of FIG. 4, tip 121 needs to penetrate through layer 412 in order to touch metal pad 410. Because tip 121 is hardened with a hardening component 130, tip 121 may penetrate through layer 412 along a direction that is substantially perpendicular to metal pad 410. This is in contrast to conventional techniques where a probe penetrates an oxide layer at some angle or by using a scrubbing action to compensate for the relatively soft probe material employed.

As can be appreciated by those of ordinary skill in the art reading the present disclosure, hardening component 130 hardens tip 121 to allow it to perpendicularly penetrate layer 412, thus minimizing physical contact with metal pad 410. This, in turn, minimizes probing damage to metal pad 410. Hardening component 130 also allows for the use of a low-resistance but relatively soft material as a body 120. For example, copper may be used as a probe body when employed with a hardening component 130. Furthermore, because hardening component 130 allows for reliable penetration of layer 412, tip 121 makes a good electrical connection with metal pad 410.

Figure 5:
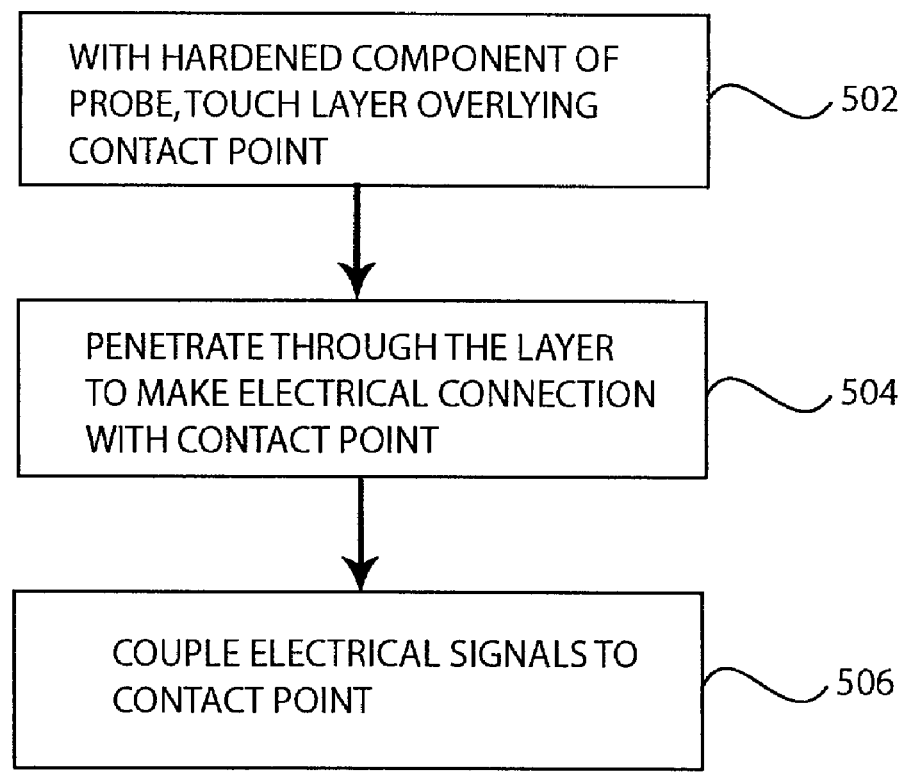
FIG. 5 shows a flow diagram of a method of testing an integrated circuit in accordance with an embodiment of the present invention.

Referring now to FIG. 5, there is shown a flow diagram of a method of testing an integrated circuit in accordance with an embodiment of the present invention. In action 502, a hardened component of a probe touches a layer overlying a contact point. The layer may be an oxide layer overlying a contact point, such as a metal pad. The hardened component may include a hardening material such as diamond dust and a conductive coating over the hardening material. Examples of conductive coating include nickel, gold, and beryllium copper.

In action 504, the hardened component of the probe is pushed through the layer to penetrate the layer and make an electrical connection with the contact point. Because the hardened component is relatively hard, it may be pushed through the layer at an angle substantially perpendicular to the contact point.

In action 506, electrical signals are coupled to the contact point via the probe. For example, once the probe makes an electrical connection with the contact point, a tester may send and receive electrical signals to and from a DUT along a path that includes the probe and the contact point.

While specific embodiments of the present invention have been provided, it is to be understood that these embodiments are for illustration purposes and not limiting. Many additional embodiments will be apparent to persons of ordinary skill in the art reading this disclosure. Thus, the present invention is limited only by the following claims.

What is claimed is:

1. A probe for testing an integrated circuit, the probe comprising:
   a body having a tip, the body being mounted in a hole of a probe card;
   a spring attached to the body, the spring being configured to allow the body to move into the hole of the probe card such that the tip travels in a substantially vertical direction with respect to a layer of an integrated circuit;
   a hardening material formed on the tip, the hardening material being configured to allow the tip to penetrate all the way through the layer of the integrated circuit to make an electrical connection to a point under the layer, the hardening material being harder than the body;
   an electrically conductive coating formed over and past the hardening material.

2. The probe of claim 1 wherein the hardening material comprises diamond dust.

3. The probe of claim 1 wherein the body is part of a pogo-type probe.

4. The probe of claim 1 wherein the body is of a material that comprises copper.

5. A method of testing an integrated circuit, the method comprising:
   touching a layer with a hardened component of a probe;
   pushing the probe such that a tip of the probe penetrates all the way through the layer at an angle substantially perpendicular to a contact point under the layer; and
   making an electrical connection between the probe and the contact point;
   wherein the hardened component comprises:
   (a) a hardening material formed on a tip of the probe, the hardening material being harder than the tip; and
   (b) an electrically conductive material formed over and past the hardening material.

6. The method of claim 5 wherein the hardening material comprises diamond dust.

7. The method of claim 5 wherein the electrically conductive coating comprises nickel.

8. The method of claim 5 wherein the probe is a pogo-type probe.

9. The method of claim 5 wherein the layer comprises an oxide layer.

10. The method of claim 5 wherein the contact point comprises a metal pad.

11. A probe for testing integrated circuits, the probe comprising:
    means for retracting a body of a probe in a substantially vertical direction with respect to a layer of an integrated circuit;
    means for penetrating through the layer of the integrated circuit; and
    means for contacting a metal pad under the layer, the means for contacting the metal pad comprising a hardening material on the body of the probe and a conductive coating formed over and past the hardening material, the hardening material being harder than the body of the probe.

12. The probe of claim 11 wherein the means for retracting comprises a spring.

13. The probe of claim 11 wherein the hardening material comprises diamond dust.

14. The probe of claim 11 wherein the body of the probe is of a material that comprises copper.

* * * * *

UNITED STATES PATENT AND TRADEMARK OFFICE
CERTIFICATE OF CORRECTION

PATENT NO. : 7,112,974 B1 Page 1 of 1
APPLICATION NO. : 10/154089
DATED : September 26, 2006
INVENTOR(S) : Jin et al.

It is certified that error appears in the above-identified patent and that said Letters Patent is hereby corrected as shown below:

on Title page, item 54 and Col. 1, Line 1 replace the Title with,

-- PROBE FOR TESTING INTEGRATED CIRCUITS --

Signed and Sealed this

Twelfth Day of December, 2006

JON W. DUDAS
*Director of the United States Patent and Trademark Office*